US011075105B2

(12) United States Patent
Sarode Vishwanath et al.

(10) Patent No.: US 11,075,105 B2
(45) Date of Patent: Jul. 27, 2021

(54) IN-SITU APPARATUS FOR SEMICONDUCTOR PROCESS MODULE

(71) Applicant: Applied Materials, Inc., Santa Clara, CA (US)

(72) Inventors: Yogananda Sarode Vishwanath, Bangalore (IN); Steven E. Babayan, Los Altos, CA (US); Stephen Prouty, San Jose, CA (US); Andreas Schmid, Meyriez (CH)

(73) Assignee: APPLIED MATERIALS, INC., Santa Clara, CA (US)

(*) Notice: Subject to any disclaimer, the term of this patent is extended or adjusted under 35 U.S.C. 154(b) by 255 days.

(21) Appl. No.: 16/103,531

(22) Filed: Aug. 14, 2018

(65) Prior Publication Data
US 2019/0088531 A1 Mar. 21, 2019

Related U.S. Application Data

(60) Provisional application No. 62/561,463, filed on Sep. 21, 2017.

(51) Int. Cl.
H01L 21/687 (2006.01)
C23C 16/458 (2006.01)
(Continued)

(52) U.S. Cl.
CPC .... H01L 21/68707 (2013.01); C23C 16/4584 (2013.01); C23C 16/4585 (2013.01); H01J 37/32623 (2013.01); H01L 21/67748 (2013.01); H01L 21/6831 (2013.01); H01L 21/68721 (2013.01); H01L 21/68742 (2013.01)

(58) Field of Classification Search
CPC ........ H01L 21/68707; H01L 21/68742; H01L 21/68721; H01L 21/67748
See application file for complete search history.

(56) References Cited

U.S. PATENT DOCUMENTS 4,542,712 A * 9/1985 Sato ........................ C30B 23/02
118/500
5,162,047 A * 11/1992 Wada ................ H01L 21/67778
29/25.01
(Continued)

FOREIGN PATENT DOCUMENTS

CN 105336561 A 2/2016
CN 105789010 A 7/2016
(Continued)

OTHER PUBLICATIONS

Taiwan Office Action dated Sep. 20, 2019 for Application No. 106100104 (APPM/23690TW).
(Continued)

Primary Examiner — Aiden Lee
(74) Attorney, Agent, or Firm — Patterson + Sheridan, LLP

(57) ABSTRACT

Aspects of the present disclosure generally relate to apparatuses and methods for edge ring replacement in processing chambers. In one aspect, a carrier for supporting an edge ring is disclosed. In other aspects, robot blades for supporting a carrier are disclosed. In another aspect, a support structure for supporting a carrier in a degassing chamber is disclosed. In another aspect, a method of transferring an edge ring on a carrier is disclosed.

16 Claims, 14 Drawing Sheets

(51) Int. Cl.
*H01J 37/32* (2006.01)
*H01L 21/677* (2006.01)
*H01L 21/683* (2006.01)

(56) References Cited

U.S. PATENT DOCUMENTS

| | | | |
|---|---|---|---|
| 5,267,607 A | 12/1993 | Wada | |
| 5,445,486 A * | 8/1995 | Kitayama | H01L 21/68707 |
| | | | 414/416.03 |
| 5,660,673 A | 8/1997 | Miyoshi | |
| 5,730,801 A | 3/1998 | Tepman et al. | |
| 5,762,714 A | 6/1998 | Mohn et al. | |
| 5,851,140 A | 12/1998 | Barns et al. | |
| 5,885,428 A | 3/1999 | Kogan | |
| 6,022,809 A | 2/2000 | Fan | |
| 6,044,534 A * | 4/2000 | Seo | H01L 21/68707 |
| | | | 29/25.01 |
| 6,155,773 A * | 12/2000 | Ebbing | H01L 21/67742 |
| | | | 294/103.1 |
| 6,206,976 B1 | 3/2001 | Crevasse et al. | |
| 6,375,748 B1 | 4/2002 | Yudovsky et al. | |
| 6,511,543 B1 | 1/2003 | Stauss et al. | |
| 6,537,011 B1 * | 3/2003 | Wang | H01L 21/68707 |
| | | | 118/728 |
| 6,589,352 B1 | 7/2003 | Yudovsky et al. | |
| 6,676,759 B1 | 1/2004 | Takagi | |
| 6,709,547 B1 | 3/2004 | Ni et al. | |
| 6,744,212 B2 | 6/2004 | Fischer et al. | |
| 6,773,562 B1 | 8/2004 | Inagawa et al. | |
| 6,896,765 B2 | 5/2005 | Steger | |
| 6,898,558 B2 | 5/2005 | Klekotka | |
| 7,128,806 B2 * | 10/2006 | Nguyen | H01J 37/321 |
| | | | 156/345.51 |
| 7,138,014 B2 | 11/2006 | Stevens et al. | |
| 7,138,067 B2 | 11/2006 | Vahedi et al. | |
| 7,311,784 B2 | 12/2007 | Fink | |
| 7,338,578 B2 | 3/2008 | Huang et al. | |
| 7,589,950 B2 | 9/2009 | Parkhe et al. | |
| 7,824,146 B2 | 11/2010 | Lanee et al. | |
| 7,968,469 B2 | 6/2011 | Collins et al. | |
| 8,270,141 B2 | 9/2012 | Willwerth et al. | |
| 8,298,371 B2 | 10/2012 | Koshimizu et al. | |
| 8,933,628 B2 | 1/2015 | Banna et al. | |
| 8,988,848 B2 | 3/2015 | Todorow et al. | |
| 8,999,106 B2 | 4/2015 | Liu et al. | |
| 9,011,637 B2 | 4/2015 | Yamamoto | |
| 9,076,636 B2 | 7/2015 | Ohata et al. | |
| 9,142,391 B2 | 9/2015 | Yamamoto | |
| 9,287,093 B2 | 3/2016 | Singh et al. | |
| 9,410,249 B2 | 8/2016 | Male et al. | |
| 9,583,357 B1 | 2/2017 | Long et al. | |
| 9,601,319 B1 | 3/2017 | Bravo et al. | |
| 9,620,376 B2 | 4/2017 | Kamp et al. | |
| 9,761,459 B2 | 9/2017 | Long et al. | |
| 9,852,889 B1 | 12/2017 | Kellogg et al. | |
| 9,881,820 B2 | 1/2018 | Wong et al. | |
| 9,947,517 B1 | 4/2018 | Luere et al. | |
| 10,103,010 B2 | 10/2018 | Luere et al. | |
| 2003/0173031 A1 | 9/2003 | Aggarwal et al. | |
| 2003/0201069 A1 | 10/2003 | Johnson | |
| 2004/0053428 A1 | 3/2004 | Steger | |
| 2004/0149389 A1 | 8/2004 | Fink | |
| 2004/0261946 A1 | 12/2004 | Endoh et al. | |
| 2005/0061447 A1 | 3/2005 | Kim et al. | |
| 2005/0092438 A1 * | 5/2005 | Hur | H01L 21/68742 |
| | | | 156/345.47 |
| 2005/0133164 A1 | 6/2005 | Fischer et al. | |
| 2006/0097438 A1 * | 5/2006 | Krieg | H01L 21/68707 |
| | | | 269/203 |
| 2008/0066868 A1 | 3/2008 | Masuda | |
| 2008/0173237 A1 | 7/2008 | Collins et al. | |
| 2008/0236749 A1 | 10/2008 | Koshimizu et al. | |
| 2008/0289766 A1 | 11/2008 | Heemstra et al. | |
| 2009/0041568 A1 | 2/2009 | Muraoka et al. | |
| 2009/0067954 A1 | 3/2009 | Lanee et al. | |
| 2010/0101729 A1 | 4/2010 | Kim et al. | |
| 2010/0196625 A1 | 8/2010 | Yoon et al. | |
| 2010/0206484 A1 * | 8/2010 | Hiromi | H01L 21/68721 |
| | | | 156/345.51 |
| 2011/0031111 A1 | 2/2011 | Kobayashi | |
| 2011/0157760 A1 | 6/2011 | Willwerth et al. | |
| 2011/0287631 A1 | 11/2011 | Yamamoto | |
| 2012/0052599 A1 | 3/2012 | Brouk et al. | |
| 2012/0091108 A1 | 4/2012 | Lin et al. | |
| 2012/0176692 A1 | 7/2012 | Yamawaku et al. | |
| 2012/0176892 A1 | 7/2012 | Yamawaku et al. | |
| 2012/0247671 A1 * | 10/2012 | Sugawara | H01L 21/68728 |
| | | | 156/345.31 |
| 2012/0256363 A1 | 10/2012 | Okita et al. | |
| 2012/0305184 A1 | 12/2012 | Singh et al. | |
| 2013/0068727 A1 * | 3/2013 | Okita | H01L 21/68764 |
| | | | 216/59 |
| 2013/0093443 A1 | 4/2013 | Patrick | |
| 2013/0106286 A1 | 5/2013 | Banna et al. | |
| 2013/0155568 A1 | 6/2013 | Todorow et al. | |
| 2014/0017900 A1 | 1/2014 | Doba et al. | |
| 2014/0213055 A1 | 7/2014 | Himori et al. | |
| 2014/0265089 A1 | 9/2014 | Tantiwong et al. | |
| 2015/0064809 A1 | 3/2015 | Lubomirsky | |
| 2015/0181684 A1 | 6/2015 | Banna et al. | |
| 2015/0200124 A1 | 7/2015 | Yamamoto | |
| 2015/0332951 A1 | 11/2015 | Male et al. | |
| 2016/0042926 A1 | 2/2016 | Ishikawa et al. | |
| 2016/0056017 A1 | 2/2016 | Kim et al. | |
| 2016/0211165 A1 | 7/2016 | McChesney et al. | |
| 2016/0211166 A1 | 7/2016 | Yan et al. | |
| 2016/0240415 A1 | 8/2016 | Sekiya | |
| 2017/0018411 A1 | 1/2017 | Sriraman et al. | |
| 2017/0069462 A1 | 3/2017 | Kanarik et al. | |
| 2017/0103870 A1 | 4/2017 | Marakhtanov et al. | |
| 2017/0110335 A1 | 4/2017 | Yang et al. | |
| 2017/0113355 A1 | 4/2017 | Genetti et al. | |
| 2017/0115657 A1 | 4/2017 | Trussell et al. | |
| 2017/0117170 A1 | 4/2017 | Wong et al. | |
| 2017/0117172 A1 | 4/2017 | Genetti et al. | |
| 2017/0133283 A1 | 5/2017 | Kenworthy | |
| 2017/0178917 A1 | 6/2017 | Kamp et al. | |
| 2017/0213758 A1 | 7/2017 | Rice et al. | |
| 2017/0236688 A1 | 8/2017 | Caron et al. | |
| 2017/0236741 A1 | 8/2017 | Angelov et al. | |
| 2017/0236743 A1 | 8/2017 | Severson et al. | |
| 2017/0250056 A1 | 8/2017 | Boswell et al. | |
| 2017/0263478 A1 | 9/2017 | McChesney et al. | |
| 2017/0287682 A1 | 10/2017 | Musselman et al. | |
| 2017/0287753 A1 | 10/2017 | Musselman et al. | |
| 2017/0316935 A1 | 11/2017 | Tan et al. | |
| 2017/0330786 A1 | 11/2017 | Genetti et al. | |
| 2017/0334074 A1 | 11/2017 | Genetti et al. | |
| 2017/0372912 A1 | 12/2017 | Long et al. | |
| 2018/0019107 A1 | 1/2018 | Ishizawa | |
| 2018/0052104 A1 | 2/2018 | Larsson et al. | |
| 2018/0090354 A1 | 3/2018 | Sugita et al. | |
| 2018/0105934 A1 * | 4/2018 | Jang | C23C 16/4585 |
| 2018/0166259 A1 | 6/2018 | Ueda | |
| 2018/0190535 A1 * | 7/2018 | Weaver | H01L 21/67739 |
| 2018/0218933 A1 | 8/2018 | Luere et al. | |
| 2018/0233328 A1 | 8/2018 | Ueda et al. | |
| 2018/0277416 A1 | 9/2018 | Takahashi et al. | |
| 2018/0301322 A1 | 10/2018 | Sugita et al. | |
| 2018/0308737 A1 | 10/2018 | Moriya et al. | |
| 2018/0315583 A1 | 11/2018 | Luere et al. | |
| 2018/0315640 A1 | 11/2018 | Ueda et al. | |
| 2019/0013232 A1 | 1/2019 | Yan et al. | |
| 2019/0088531 A1 | 3/2019 | Sarode Vishwanath et al. | |
| 2019/0172688 A1 | 6/2019 | Ueda | |
| 2019/0172714 A1 | 6/2019 | Bobek et al. | |
| 2019/0333785 A1 | 10/2019 | Tanikawa | |
| 2019/0362949 A1 | 11/2019 | Sarode Vishwanath | |
| 2020/0020510 A1 | 1/2020 | Shoeb et al. | |

FOREIGN PATENT DOCUMENTS

| | | |
|---|---|---|
| JP | 2000049144 A | 2/2000 |
| JP | 3020898 B2 | 3/2000 |

(56) References Cited

FOREIGN PATENT DOCUMENTS

| | | |
|---|---|---|
| JP | 2001230239 A | 8/2001 |
| JP | 2002176030 A | 6/2002 |
| JP | 2006186171 A | 7/2006 |
| JP | 2008078208 A | 4/2008 |
| JP | 2011054933 A | 3/2011 |
| JP | 2013511847 A | 4/2013 |
| JP | 2015050156 A | 3/2015 |
| KR | 20060117537 A | 11/2006 |
| KR | 100980972 B1 | 9/2010 |
| TW | 439093 B | 6/2001 |
| TW | 201324674 A | 6/2013 |
| WO | 2008005756 A2 | 1/2008 |
| WO | 2013035983 A1 | 3/2013 |

OTHER PUBLICATIONS

"Bracelet Holder Vise Clamp Stone Prong Pave Channel Setting Setter." Prolinemax, www.prolinemax.com/Bracelet-Holder-Vise-Clamp-Stone-Prong-Pave-Channel-Setting-Setter-_p_1006.html., Accessed Jun. 1, 2017.
Chinese Office Action for Application No. 201821554985.2 dated Feb. 19, 2019 (APPM/25317CNU).
PCT Notification of Transmittal of the international Search Report and the Written Opinion of the International Searching Authority for International Application No. PCT/US2019/051771; dated Mar. 24, 2020; 11 total pages.
Japanese Office Action for Application No. JP 2019-111014 dated Aug. 25, 2020.
International Search Report and Written Opinion for PCT/US2020/016242 (APPM/44016122PC) dated Jul. 14, 2020.
Japanese Office Action dated Oct. 27, 2020 for Application No. 2018-522911 (APPM/23690JP).
Korean Office Action in related application 10-2019-0069336 dated Nov. 11, 2020.

* cited by examiner

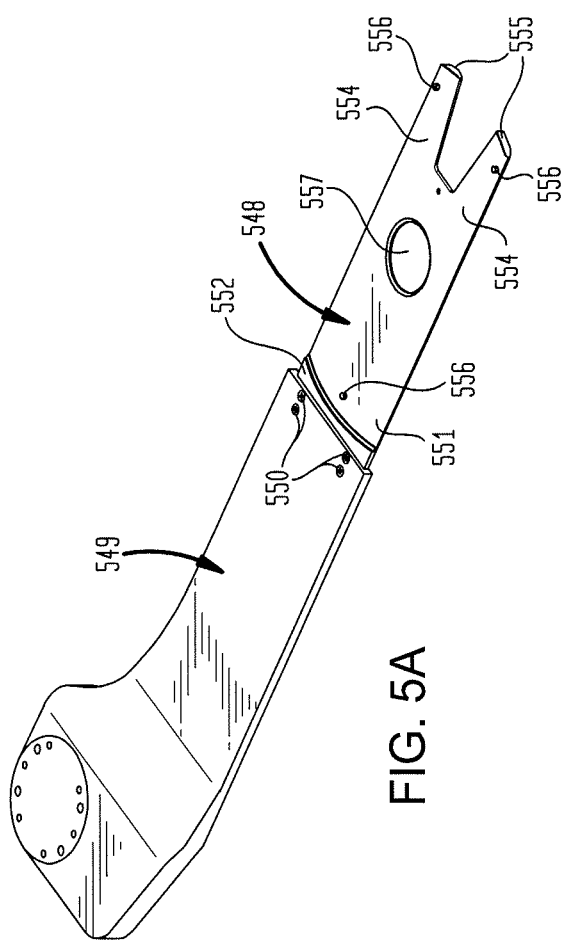
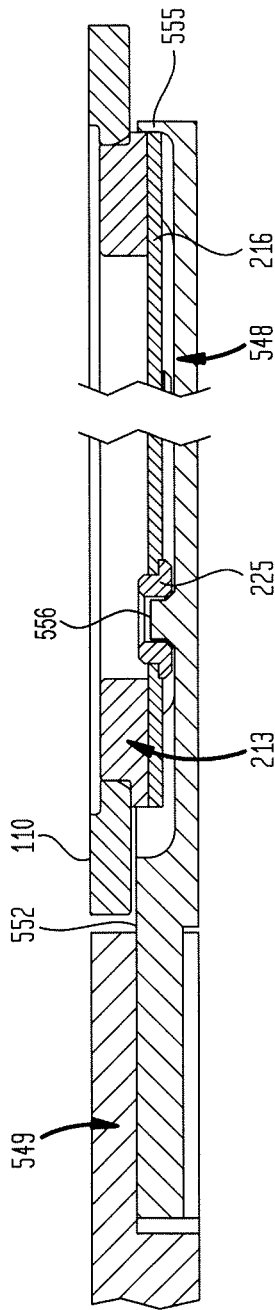
FIG. 5A
FIG. 5B

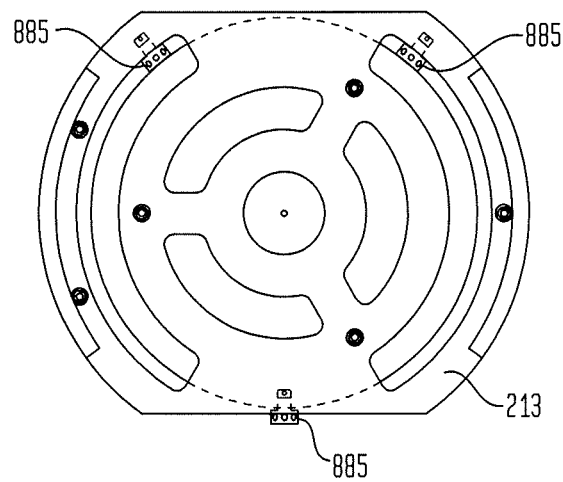
FIG. 8A
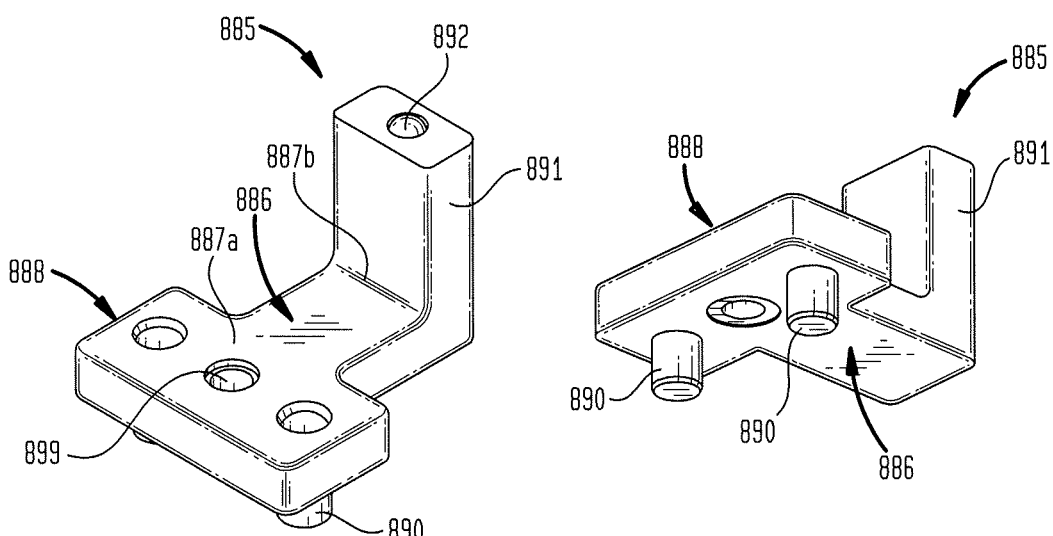
FIG. 8B
FIG. 8C

IN-SITU APPARATUS FOR SEMICONDUCTOR PROCESS MODULE

CROSS-REFERENCE TO RELATED APPLICATION

This application claims benefit of U.S. Provisional Patent application Ser. No. 62/561,463 filed Sep. 21, 2017, which is incorporated herein by reference.

BACKGROUND

Field

Aspects of the present disclosure generally relate to apparatuses and methods for edge ring replacement in processing chambers, such as those used in semiconductor processing.

Description of the Related Art

In processing chambers, such as etch chambers, substrates are etched while electrostatically clamped in position. Typically, a circular part, referred to as an edge ring, is positioned immediately outside of the outer diameter of the substrate to protect the upper surface of the electrostatic chuck from being etched by etchant chemistry. Edge rings are made from several different materials and can have different shapes, both which affect process uniformity near the edge ring. During processing, edge rings are etched over time thereby resulting in shape changes as well as changes in processing uniformity.

To address the changes in processing uniformity due to edge ring deterioration, edge rings are changed according to a schedule. Conventionally, to replace an edge ring, processing chambers are opened to allow an operator to have access to the edge ring inside. However, this process is time consuming, and due to venting of the processing chambers, may take up to 24 hours to get processing back online.

Therefore, there is a need for new methods and apparatuses for replacing edge rings.

SUMMARY

Aspects of the present disclosure generally relate to apparatuses and methods for edge ring replacement in processing chambers.

In one aspect, a carrier for supporting an edge ring includes a plate having a perimeter including two opposing curved edges. The carrier further includes a first plurality of receptacles disposed in the plate with each configured to receive a lift pin therein, and a second plurality of receptacles disposed in the plate with each configured to engage a supporting structure. A first arcuate support structure is coupled to one of the two opposing curved edges, the first arcuate support structure extending above a plane of an upper surface of the plate. A second arcuate support structure is coupled to the other of the two opposing curved edges, the second arcuate support structure extending above the plane of the upper surface of the plate.

In another aspect, a robot blade includes a base and two fingers extending from the base. A base carrier engagement feature is coupled to an upper surface of the base, and finger carrier engagement features are each coupled to an upper surface of a respective one of the two fingers.

In another aspect, a method of transferring an edge ring includes inserting a robot blade into a chamber through a slit valve door, the robot blade having a carrier and an edge ring thereon, positioning the carrier and the edge ring thereon over a substrate support, actuating substrate lift pins to lift the carrier from the robot blade, and retracting the robot blade from the chamber.

In another aspect, a carrier for supporting an edge ring comprises a semi-circular plate. The semi-circular plate has a perimeter defined by two parallel edges and two opposing curved edges coupling the two parallel edges. A first plurality of receptacles is disposed in the semi-circular plate, each receptacle configured to receive a lift pin therein. A second plurality of receptacles is disposed in the semi-circular plate, each receptacle configured to engage a supporting structure. A first arcuate support structure is coupled to one of the two opposing curved edges. The first arcuate support structure extends above a plane of an upper surface of the semi-circular plate. A second arcuate support structure is coupled to one of the two opposing curved edges, the second arcuate support structure extending above the plane of the upper surface of the semi-circular plate.

In another aspect, a robot blade comprises a base and two fingers extending from the base. The robot blade also includes two end pads, wherein one of the two end pads is disposed at each distal end of one of the two fingers. The robot blade also includes a base pad coupled to the base, and a roller configured to actuate from the base towards the two fingers.

In another aspect, a robot blade comprises a base having an elevated ridge formed on an upper surface thereof, and two fingers extending from the base. Each finger has elevated ridges formed on upper surfaces thereof at respective distal ends thereof, wherein the elevated ridges formed on upper surfaces of the two fingers and the elevated ridge formed on an upper surface of the base are arcs of a common circle. The robot blade also includes a plurality of engagement posts, wherein one of the plurality engagement posts is formed on an upper surface of the base, and one of the plurality of engagement posts is formed on upper surfaces of each of the two fingers.

In another aspect, a method of transferring an edge ring comprises inserting a robot blade into a chamber through a slit valve door, the robot blade having a carrier and an edge ring thereon. The carrier and the edge ring thereon are positioned over a substrate support, and substrate lift pins are actuated to lift the carrier from the robot blade. The robot blade is retracted from the chamber, and the substrate lift pins are actuated to lower the carrier toward the substrate support. A second set of lift pins are actuated to lift the edge ring from the carrier, and the robot blade is inserted in the chamber and engages the carrier. The carrier and the robot blade are removed from the chamber, and the edge ring is lowered into contact with the substrate support.

In another aspect a support structure for supporting a substrate carrier comprises a base having a first end and a second end, and a cross member disposed at the first end of the base. The cross member is disposed in a same plane as the base and having a width greater than the base. The cross member includes an opening formed therethrough, and at least two support posts extending from a surface of the cross member, the at least two support posts positioned on opposite sides of the opening. The support structure also includes a vertical member extending from the second end of the base. The vertical member extends in a direction opposite to the at least two support posts of the cross member. The vertical member includes a ball bearing or contact pad at one end thereof.

BRIEF DESCRIPTION OF THE DRAWINGS

So that the manner in which the above recited features of the present disclosure can be understood in detail, a more particular description of the disclosure, briefly summarized above, may be had by reference to aspects, some of which are illustrated in the appended drawings. It is to be noted, however, that the appended drawings illustrate only exemplary aspects and are therefore not to be considered limiting of scope, as the disclosure may admit to other equally effective aspects.

FIG. 5A is a schematic perspective view of a robot blade, according to one aspect of the disclosure.

FIG. 5B is a schematic sectional view of the robot blade of FIG. 5A supporting a carrier, according to one aspect of the disclosure.

FIG. 8A is a schematic illustration of a carrier in a degassing chamber.

FIGS. 8B and 8C are schematic perspective views of a support finger, according to aspects of the disclosure.

To facilitate understanding, identical reference numerals have been used, where possible, to designate identical elements that are common to the figures. It is contemplated that elements and features of one aspect may be beneficially incorporated in other aspects without further recitation.

DETAILED DESCRIPTION

Aspects of the present disclosure generally relate to apparatuses and methods for edge ring replacement in processing chambers. In one aspect, a carrier for supporting an edge ring is disclosed. In another aspect, one or more robot blades for supporting a carrier are disclosed. In another aspect, a support structure for supporting a carrier in a degassing chamber is disclosed. In yet another aspect, a method of transferring an edge ring on a carrier is disclosed.

Figure 1:
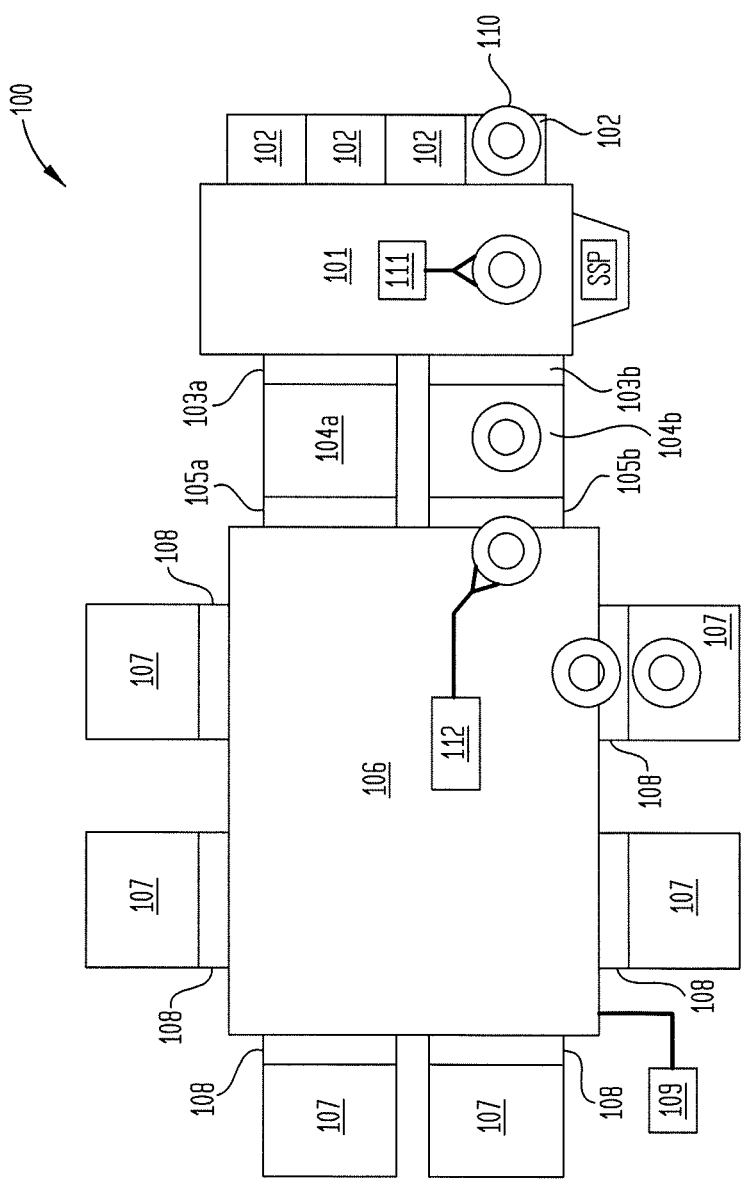
FIG. 1 illustrates a processing system, according to one aspect of the disclosure.

FIG. 1 illustrates a processing system 100, according to one aspect of the disclosure. The processing system 100 includes a factory interface 101 to which a plurality of substrate cassettes 102 may be coupled for transferring substrates into the processing system 100. The processing system 100 also includes first vacuum ports 103a, 103b coupling the factory interface 101 to respective degassing chambers 104a, 104b. Second vacuum ports 105a, 105b are coupled to respective degassing chambers 104a, 104b and disposed between the degassing chambers 104a, 104b and a transfer chamber 106 to facilitate transfer of substrates into the transfer chamber 106. The transfer chamber 106 includes a plurality of processing chambers 107 disposed therearound and coupled thereto. The processing chambers 107 are coupled to the transfer chamber 106 through respective ports 108, such as slit valves or the like. A controller 109 controls various aspects of the processing system 100.

The processing chambers 107 may include or more of etch chambers, deposition chambers (including atomic layer deposition, chemical vapor deposition, physical vapor deposition, or plasma enhanced versions thereof), anneal chambers, and the like. Some of the processing chambers 107, such as etch chambers, may include edge rings therein, which occasionally require replacement. While conventional systems require disassembly of a processing chamber by an operator to replace an edge ring, the processing system 100 is configured to facilitate replacement of edge rings without disassembly of a processing chamber 107 by an operator.

FIG. 1 schematically illustrates transfer of an edge ring 110 into a processing chamber 107. According to one aspect of the disclosure, an edge ring 110 is removed from a cassette 102 via factory interface robot 111 located in the factory interface 101, or alternatively, is loaded directly into the factory interface 101. The factory interface robot 111 transfers the edge ring 110 through one of the first vacuum ports 103a, 103b and into a respective degassing chamber 104a, 104b. A transfer chamber robot 112 located in the transfer chamber 106 removes the edge ring 110 from one of the degassing chambers 104a, 104b through a second vacuum port 105a or 105b. The transfer chamber robot 112 moves the edge ring 110 into the transfer chamber 106, where the edge ring 110 may be transferred to a desired processing chamber 107 though a respective port 108. While not shown for clarity in FIG. 1, transfer of the edge ring 110 occurs while the edge ring 110 is position on a carrier.

FIG. 1 illustrates one example of edge ring transfer, however, other examples are also contemplated. For example, it is contemplated that an edge ring may be manually loaded into the transfer chamber 106. From the transfer chamber 106, the edge ring 110 may be loaded into a processing chamber 107 by the transfer chamber robot 112. Additionally or alternatively, edge rings may be loaded in a substrate support pedestal (SSP). An additional SSP may be positioned in communication with the factory interface 101 opposite the illustrated SSP. It is contemplated that a processed edge ring 110 may be removed from the processing system 100 in reverse of any manner described herein. When utilizing two SSPs or multiple cassettes 102, it is contemplated that one SSP or cassette 102 may be used for unprocessed edge rings 110, while another SSP or cassette 102 may be used for receiving processed edge rings 110.

Figure 2A:
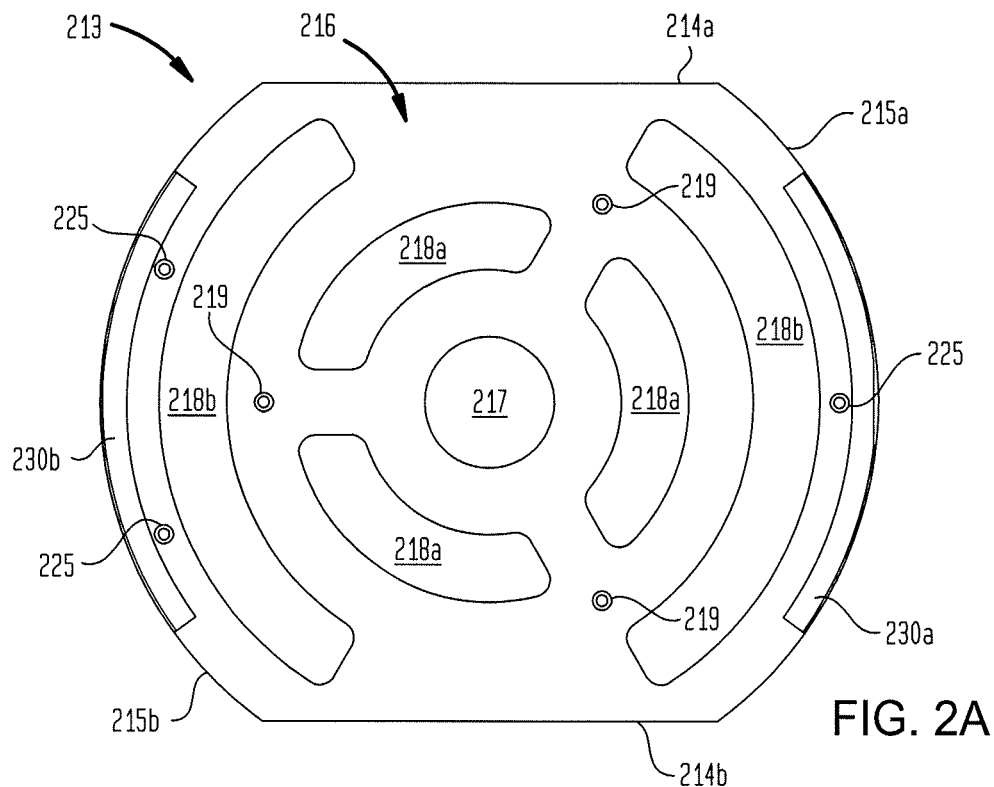
FIG. 2A is a schematic top plan view of a carrier, according to one aspect of the disclosure.
Figure 2B:
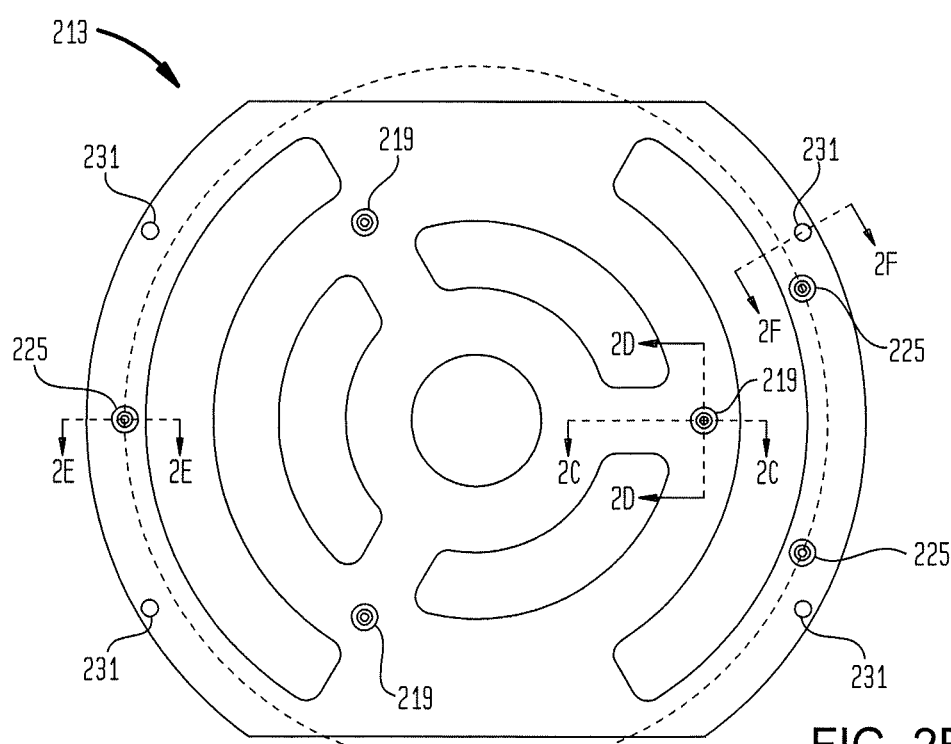
FIG. 2B is a schematic bottom plan view of the carrier of FIG. 2A.

FIG. 2A is a schematic top plan view of a carrier 213, according to one aspect of the disclosure. FIG. 2B is a schematic bottom plan view of the carrier 213 of FIG. 2A. FIGS. 2C-2F are schematic sectional views of the carrier 213 of FIG. 2A. The carrier 213 is a semi-circular plate 216 having a perimeter defined by two parallel edges 214a, 214b and two opposing curved edges 215a, 215b coupling the two parallel edges 214a, 214b. The curved edges 215a, 215b facilitate lateral support of an edge ring positioned thereon, while the two parallel edges 214a, 214b allow the carrier 213 to be accommodated in processing chambers not originally designed to accommodate a carrier 213 therein. For example, the two parallel edges 214a, 214b facilitate actuation of lift pins within a processing chamber without interfering with the carrier 213 while the carrier 213 is located within the processing chamber.

The semi-circular plate 216 includes a central opening 217 and one or more semi-circular openings (three are shown) 218a positioned concentrically around the central opening 217. Additional semi-circular openings 218b are positioned concentrically about the one or more semi-circular openings 218a. The semi-circular openings 218a, 218b facilitate a reduction in weight of the carrier 213, allowing the carrier 213 to be used on existing transfer equipment not originally designed to handle weight in excess of semiconductor wafer weights. In one example, the semi-circular plate 216 is formed from one or more materials including carbon fiber, graphite, silicon carbide, graphite-coated-silicon-carbide, silicon nitride, silicon oxide, alumina, and the like. Other materials are also contemplated.

The semi-circular plate 216 also includes a first plurality of receptacles 219 disposed therein. The receptacles 219 are metallic caps disposed in bores formed through the semi-circular plate 216. The receptacles 219 are sized and configured to receive a lift pin therein to facilitate actuation of the carrier 213 within a processing chamber. The receptacles 219 are each located at the same radial distance from a center of the semi-circular plate 216. In one example, the receptacles 219 are positioned at a radius greater than a radius of the semi-circular openings 218a, but at a radius less than a radius of the semi-circular openings 218b.

Figure 2C:
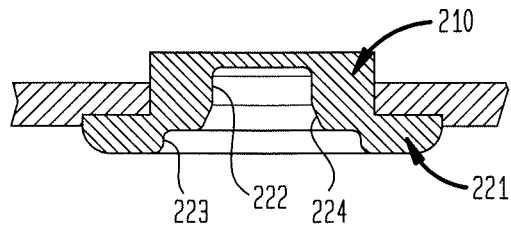
FIGS. 2C-2F are schematic sectional views of the carrier of FIG. 2A.
Figure 2D:
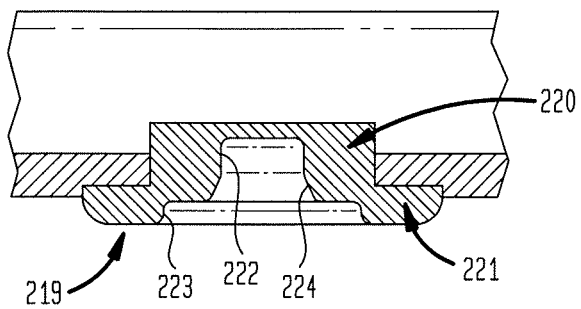
Figure 2E:
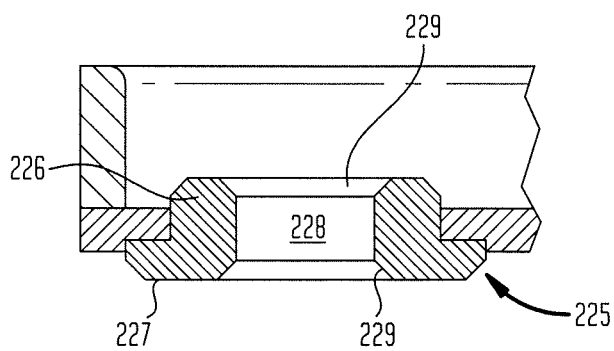

FIGS. 2C and 2D are schematic sectional views of a receptacle 219. The receptacle 219 includes a body 220 having a cylindrical shape, and a flared base 221 at one end of the body. The body 220 is disposed through the semi-circular plate 216, while the flared base 221 is partially positioned in and contacts a counterbore formed on a lower surface of the semi-circular plate 216. The receptacle 219 includes a first recess 222 extending into the body 220, and a counterbore 223 formed in the flared base 221. The recess 222 and the counterbore 223 are coupled by a tapering sidewall 224 to facilitate feature engagement. In one example, the recess 222 has an oblong or parabolic shape to accommodate a diametrical alignment feature. In such an example, the recess 222 may have a greater width in a direction parallel to the two parallel edges 214a, 214b, as opposed to a direction perpendicular to the two parallel edges 214a, 214b. The parabolic or oblong shape of the recess 222 facilitates accommodation of the lift pin within the recess 222.

The semi-circular plate 216 also includes a second plurality of receptacles 225 (three are shown) disposed therein. The receptacles 225 are each configured to engage a supporting structure, such as a robot blade. Engagement of the receptacles 225 by the supporting structure reduces or prevents relative movement between the carrier 213 and the supporting structure during transfer of the carrier 213. For example, the supporting structure may include corresponding male plugs to be received within the receptacles 225.

The receptacles 225 include a body 226 disposed in an opening formed in the semi-circular plate 216. The receptacles 225 also include a flared portion 227 disposed at one end of the body 226. The flared portion 227 has a diameter greater than the body 226, and is partially disposed in a counterbore formed on the bottom side of the semi-circular plate 216. A bore 228 is formed through the body 226 and the flared portion 227, and includes countersinks 229 at opposing ends thereof. The countersink 229 on a lower end thereof facilitates guiding of a male plug into the receptacle 225.

Each of the receptacles 219, 225 may be formed from one or more of a metal, silicon carbide, graphite, alumina, silicon nitride, silicon oxide, polyethylene terephthalate, or a ceramic material. Other materials are also contemplated. In one example the receptacles 219, 225 are formed from a soft polymer material, such as Vespel®, Ultem®, acetal, PTFE, or a ceramic material such as silicon carbide, to reduce particle generation.

The carrier 213 also includes a first arcuate support structure 230a coupled to the semi-circular plate 216 at the curved edge 215a, and a second arcuate support structure 230b coupled to the semi-circular plate 216 at the curved edge 215b. Each of the first arcuate support structure 230a and the second arcuate support structure 230b is disposed on an upper surface of the semi-circular plate 216. The first arcuate support structure 230a and the second arcuate support structure 230b extend above a plane of the upper surface of the semi-circular plate 216. In one example, each of the first arcuate support structure 230a and the second arcuate support structure 230b have a length less than length of a corresponding curved edge 215a, 215b. Each of the first arcuate support structure 230a and the second arcuate support structure 230b may be formed from a material such as carbon fiber, polyethylene terephthalate, or graphite.

Figure 2F:
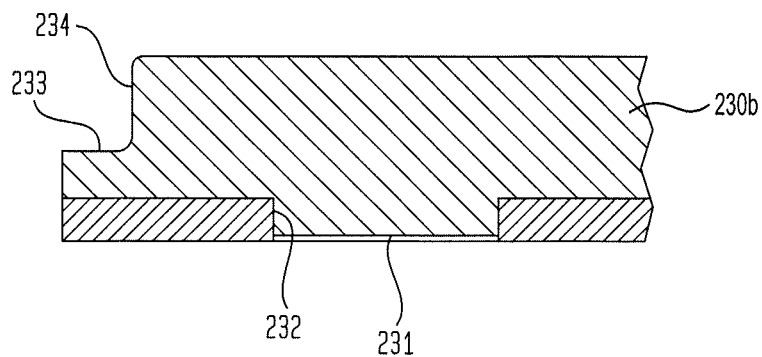

Each of the first arcuate support structure 230a and the second arcuate support structure 230b include male extensions 231 that engage openings 232 formed through the semi-circular plate 216. FIG. 2F illustrates a section view of a male extension 231 and an opening 232. The extension 231 engages the opening 232 and is maintained therein via an interference fit. In one example, the openings 232, as well as the first arcuate support structure 230a and the second arcuate support structure 230b, are positioned radially outward of the receptacles 225. Each of the first arcuate support structure 230a and the second arcuate support structure 230b has a radius of curvature that is about equal to a radius of curvature of the curved edges 215a, 215b.

Referring back to FIG. 2F, each of the first arcuate support structure 230a and the second arcuate support structure 230b include stepped surfaces on radially outward edges thereof. Each stepped surface includes a supporting surface 233 positioned approximately parallel to an upper surface of the semi-circular plate 216, and a vertical wall 234 positioned radially inward of the supporting surface 233 and oriented about perpendicular to an upper surface of the semi-circular plate 216. An edge ring (shown in FIG. 3A) engages the supporting surface 233 and the vertical wall 234 while being supported on the carrier 213. In one example, the distance between vertical walls 234 of the opposing first arcuate support structure 230a and the second arcuate support structure 230b is about equal to an inner diameter of the an edge ring, thereby reducing or mitigating movement of the edge ring relative to the carrier 213 during a transfer process. In one example, the vertical walls 234 are positioned radially outward of the male extensions 231.

While FIGS. 2A-2F illustrate one example of a carrier 213, other examples are also contemplated. For example, the carrier 213 may have a completely circular body, rather than semi-circular. Additionally or alternatively, the carrier may include circular openings rather than semi-circular openings 218a, 218b. In another example, the semi-circular openings 218a, 218b may be excluded. In such an example, the carrier 213 may be formed, at least partially, from carbon fiber, a light-weight composite material, or another high-strength, low-weight, vacuum-compatible material. In one example, the carrier 213 is symmetrical about one or more axis to mitigate imbalance during movement and placement of the carrier 213. In another example, the first arcuate support structure 230a and the second arcuate support structure 230b include outer edges which taper inwards from a lower portion thereof to an upper portion, to facilitate engagement with and alignment of an edge ring 110.

Figure 3A:
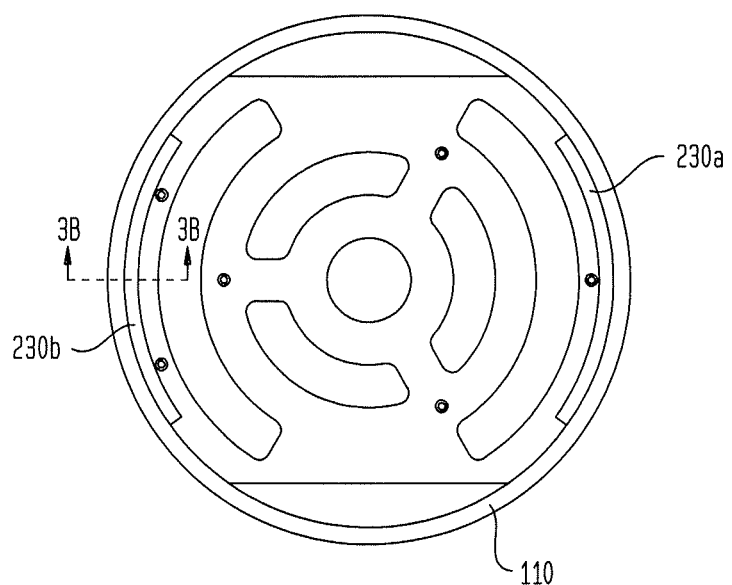
FIG. 3A is a schematic top plan view of a carrier supporting an edge ring thereon.
Figure 3B:
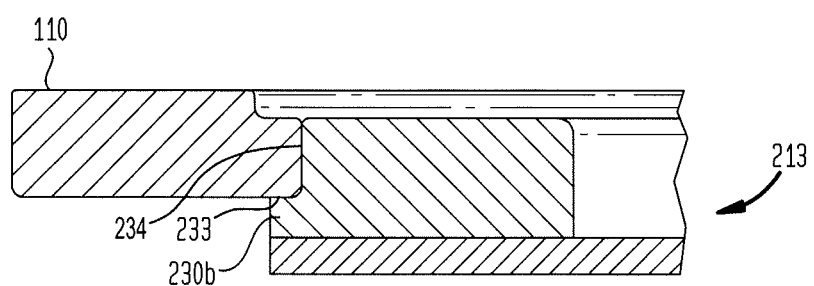
FIG. 3B is a schematic sectional view of FIG. 3A.

FIG. 3A is a schematic top plan view of a carrier 213 supporting an edge ring 110 thereon. FIG. 3B is a schematic sectional view of FIG. 3A. As shown in FIG. 3A and FIG. 3B, the edge ring 110 is disposed on and supported by the first arcuate support structure 230a and the second arcuate support structure 230b. A lower surface of the edge ring 110 contacts the supporting surfaces 233, while a radially inward edge of the edge ring 110 contacts the vertical walls 234 of the first arcuate support structure 230a and the second arcuate support structure 230b. In the illustrated example, the edge ring 110 has an inner diameter less than an outer diameter of the first arcuate support structure 230a and the second arcuate support structure 230b, and the edge ring 110 has an outer diameter greater than the outer diameters of the first arcuate support structure 230a and the second arcuate support structure 230b. Additionally, an upper surface of the edge ring 110 disposed above upper surfaces of the first arcuate support structure 230a and the second arcuate support structure 230b. In one example, one or both of the first arcuate support structure 230a and the second arcuate support structure 230b may include a feature, such as a flat surface, for engaging an electrostatic chuck or other substrate support to facilitate alignment therewith.

Figure 4B:
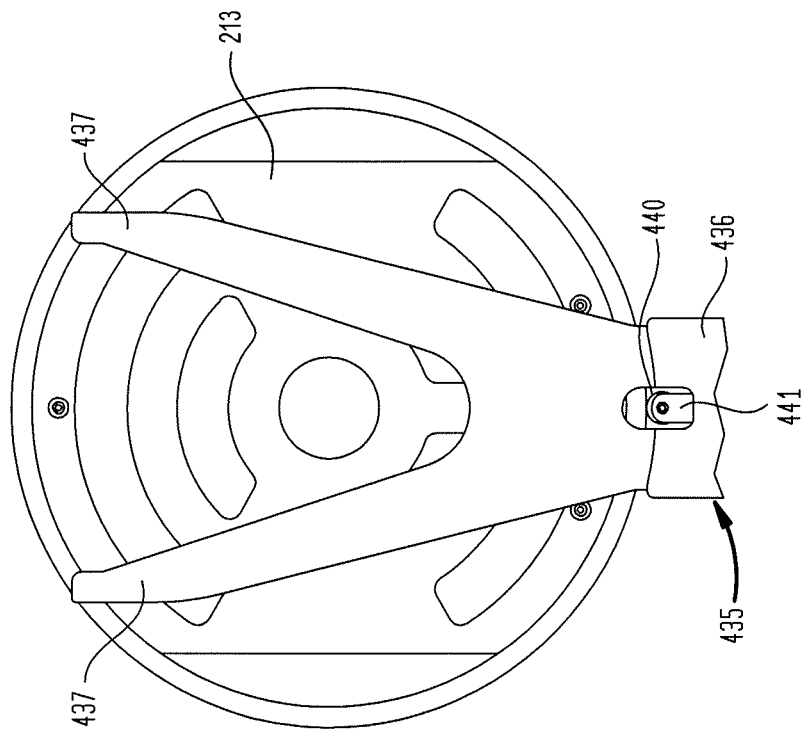
FIGS. 4A and 4B are schematic top and bottom plan views, respectively, of a robot blade supporting a carrier thereon, according to one aspect of the disclosure.
Figure 4A:
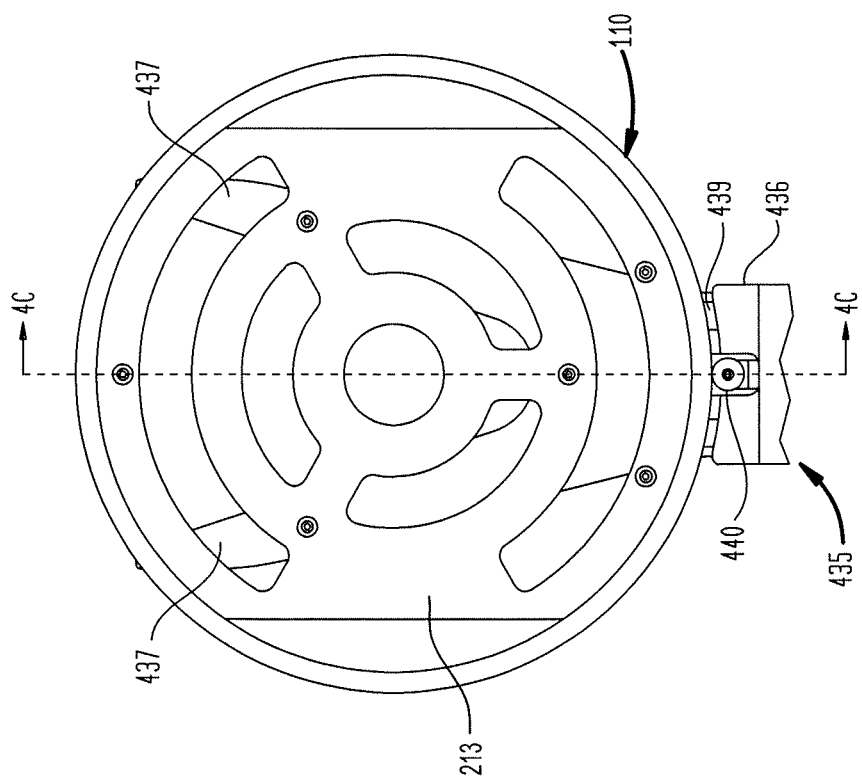
Figure 4C:
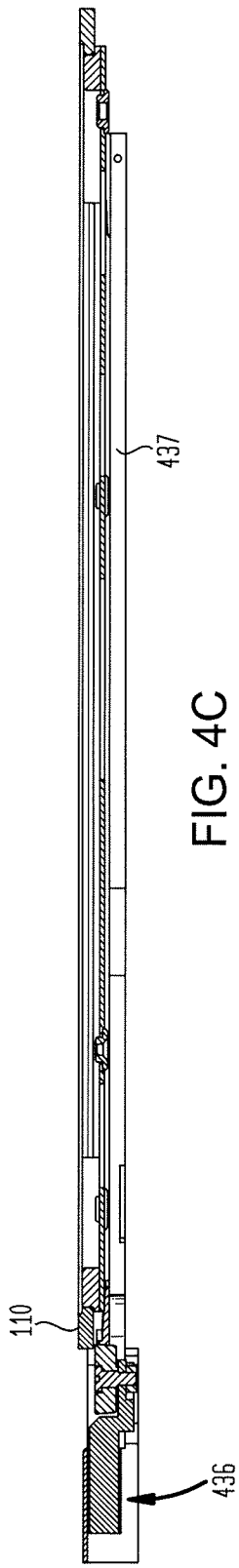
FIGS. 4C and 4D are schematic sectional views of a robot blade supporting a carrier thereon, according to one aspect of the disclosure.
Figure 4D:
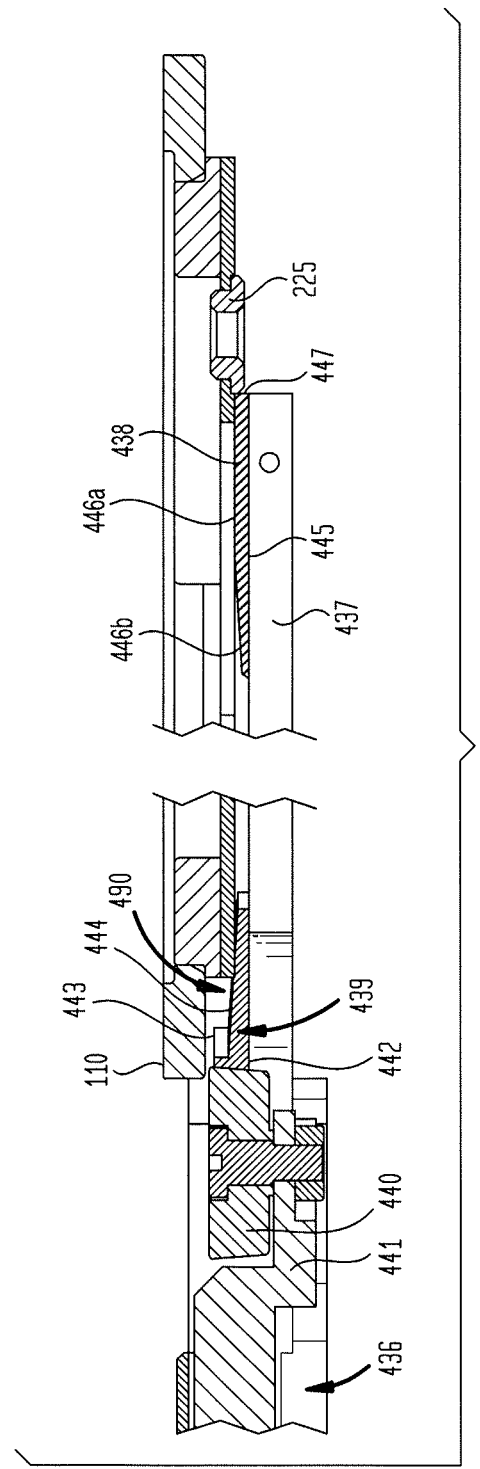

FIGS. 4A and 4B are schematic top and bottom plan views, respectively, of a robot blade 435 supporting the carrier 213 thereon, according to one aspect of the disclosure. FIGS. 4C and 4D are schematic sectional views of the robot blade 435 supporting the carrier 213 thereon, according to one aspect of the disclosure. The robot blade 435 may be used on the factory interface robot 111. However, other uses are also contemplated.

The robot blade 435 includes a base 436 and one or more fingers 437 (e.g., two fingers 437 are shown) extending from the base 436. In the example shown, the fingers 437 are palmated, but it is contemplated that discrete fingers 437 may be utilized. The base 436 may be coupled to an actuating arm of a robot to facilitate movement of the robot blade 435. In one or more embodiments, a robot blade in accordance with the present disclosure may include one or more carrier engagement features to facilitate engaging and supporting the carrier 213 with a robot blade. For example, a robot blade may include a base carrier engagement feature, such as coupled to or formed on an upper surface of the base of the robot blade, and finger carrier engagement features, such as coupled to or formed on an upper surface of each finger of the robot blade. In the example shown, the robot blade 435 includes an end pad 438 disposed at a distal end of each finger 437 for carrier engagement features. The robot blade 435 also includes one or more base pads 439 (e.g., two pads 439 are shown) coupled to an upper surface the base 436 as a base carrier engagement feature. A roller 440 is also included with the robot blade 435 and is configured to actuate inward and outward (e.g., laterally) to/from the base 436 towards the two fingers 437. The roller 440 is coupled to a sliding member 441 that moves relative to the base 436. The roller 440 may rotate about a post or may be a non-rotating member, such as a bumper. An actuator (not shown) is configured to actuate the sliding member 441 and the roller 440 towards a distal end of the finger 437 to facilitate securing of the carrier 213. With reference to FIG. 4D, the roller 440 is shown in a non-contact position, but may be actuated into contact with an outer edge of the carrier 213 to facilitate securing of the carrier 213. In a contact position of the roller 440 and the carrier 213, a gap is present between a bottom surface of the edge ring 110 and an upper surface of the roller 440 so that roller 440 may actuate without contacting the edge ring 110, thereby reducing damage to the edge ring 110 as well as reducing particle generation.

The roller 440 is positioned between two base pads 439 disposed adjacent to or abutting the base 436. An upper surface 490 of each base pad 439 is a supporting surface for the carrier 213. Each base pad 439 includes a planar lower surface 442 disposed on an upper surface of the fingers 437 (or a palm thereof) at a proximal end thereof. The upper surface 490 of each base pad 439 includes a step 443 adjacent the base 436, and a tapered portion 444 tapering downward from the step 443 towards a distal end of the fingers 437. In one example, the carrier 213 rests upon the tapered portion 444 of the upper surface 490 during transport.

The fingers 437 additionally include end pads 438 disposed at distal ends thereof. The end pads 438 are formed from the same or similar material as the base pads 439. The end pads 438 facilitate support of the carrier 213 at or near the end of the fingers 437, and are sized and shaped to maintain the carrier 213 parallel to the fingers 437 during transport of the carrier 213. In one example, the end pads 438 include a planar lower surface 445 in contact with the fingers 437, and an upper surface having a planar portion 446a, which contacts the carrier 213, and a tapered portion 446b, proximal the planar portion 446a. In one example, a height of the base pads 439 and the end pads 438 are selected to provide spacing between a lower surface of receptacles 225 and an upper surface of the fingers 437.

In one example, the roller 440, each end pad 438, and each base pad 439 is a padded material to reduce damage to the carrier 213. In another example, the roller 440, each end pad 438, and each base pad 439 is formed from silicon oxide, silicon nitride, silicon carbide, or polyethylene terephthalate. The fingers 437 and the base 436 may be formed from a metal or metal alloy, such as aluminum, or a ceramic material, such as silicon carbide.

FIG. 5A is a schematic view of a robot blade 548 and a robot wrist 549, according to one aspect of the disclosure. FIG. 5B is a sectional view of the robot blade 548 of FIG. 5A supporting the carrier 213 and the edge ring 110, according to one aspect of the disclosure. In one aspect, the robot blade 548 is configured to be coupled to existing robot wrists, or may be coupled to the robot wrist 549 by one or more fasteners 550, such as bolts. In turn, the robot wrist 549 may be coupled to a robot to facilitate movement of the robot blade 548. In one example, the robot blade 548, and optionally the robot wrist 549, may be utilized with the transfer chamber robot 112 (shown in FIG. 1).

The robot blade 548 includes a base 551 adjacent a distal end of the robot wrist 549. The base 551 has an elevated ridge 552 formed on an upper surface thereof. In one example, the elevated ridge 552 includes a stepped surface (not shown). The stepped surface may engage a carrier 213 during a transport operation to facilitate support of a carrier 213, thereby providing extra support to the carrier 213. The robot blade 548 also includes two fingers 554 extending from the base 551. Each finger 554 has an elevated ridge 555 formed on an upper surface thereof at respective distal ends thereof. Each elevated ridge 555 extends perpendicularly from the upper surface of each finger 554.

The elevated ridges 555 of the fingers 554 and the elevated ridge 552 of the base 551 are configured in semicircular or curved arrangement. In one example, the elevated ridges 555 formed on the upper surfaces of the two fingers 554 and the elevated ridge 552 formed on an upper surface of the base 551 are arcs of a common circle. In such an example, the common circle may be about the same size as the carrier 213 to facilitate support of the carrier 213.

In addition to or as an alternative to support provided by the elevated ridge 552 and the elevated ridges 555, the robot blade 548 may include a plurality of carrier engagement features, such as a plurality of engagement posts 556 (three are shown). In one example, the engagement posts 556 are cylindrical columns extending perpendicularly from an upper surface of the robot blade 548. The base 551 includes one of the engagement posts 556 formed on an upper surface thereof adjacent the elevated ridge 552, while each of the two fingers 554 includes a respective engagement post 556 disposed on a respective upper surface thereof.

As illustrated in FIG. 5B, each engagement post 556 is positioned to engage a corresponding receptacle 225 of the carrier 213. Engagement of the receptacles 225 by the engagement posts 556 reduces relative movement between the robot blade 548 and the carrier 213 during transport of the carrier 213. When the receptacles 225 are engaged by the engagements posts 556, an upper surface of the robot blade 548 is spaced from a lower surface of the semi-circular plate 216 of the carrier 213. The dimensions of the receptacles 225 are selected to provide a gap between the upper surface of the robot blade 548 and the lower surface of the semi-circular plate 216, thereby reducing contact between components and resulting in decreased particle generation.

In addition, the dimensions of the receptacles 225 may be selected to space a lower surface of the edge ring 110 from an upper surface of the elevated ridge 552 and the elevated ridges 555, thereby reducing or eliminating contact between the edge ring 110 and the robot blade 548. The reduced contact between the edge ring 110 and the robot blade 548 mitigates damage to the edge ring 110 caused by inadvertent contact with the robot blade 548. Similarly, it is to be noted that the dimensions of the robot blade 548 may be selected to maintain spacing between an edge ring 110 and the robot wrist 549, for similar reasons.

In some examples, the robot blade 548 may include one or more openings 557 formed therein. The one or more openings 557 facilitate weight reduction of the robot blade 548, thereby compensating for the weight of the carrier 213. In doing so, the robot blade 548 can be retrofitted to existing robots not originally designed for transfer of a carrier 213. In one example, the robot blade 548 may also be used to transfer substrates. In such an example, the engagement posts 556 may include rounded upper surfaces to minimize contact with the substrate being transferred, thereby reducing particle generation.

FIGS. 6A-6H schematically illustrate placement of an edge ring 110 with in a processing chamber 107, according to one aspect of the disclosure. FIG. 7 is a flow diagram of a method 760 of placing an edge ring, according to one aspect of the disclosure. To facilitate explanation, FIG. 7 is explained in conjunction with FIGS. 6A-6H.

Figure 6A:
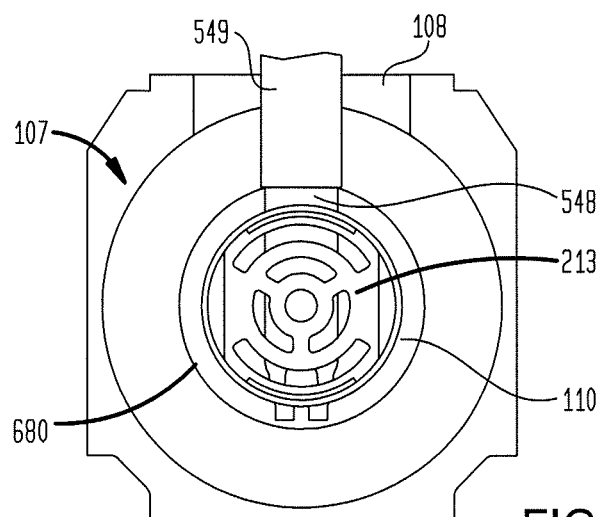
FIGS. 6A-6I schematically illustrate placement of an edge ring within a processing chamber, according to one aspect of the disclosure.
Figure 7:
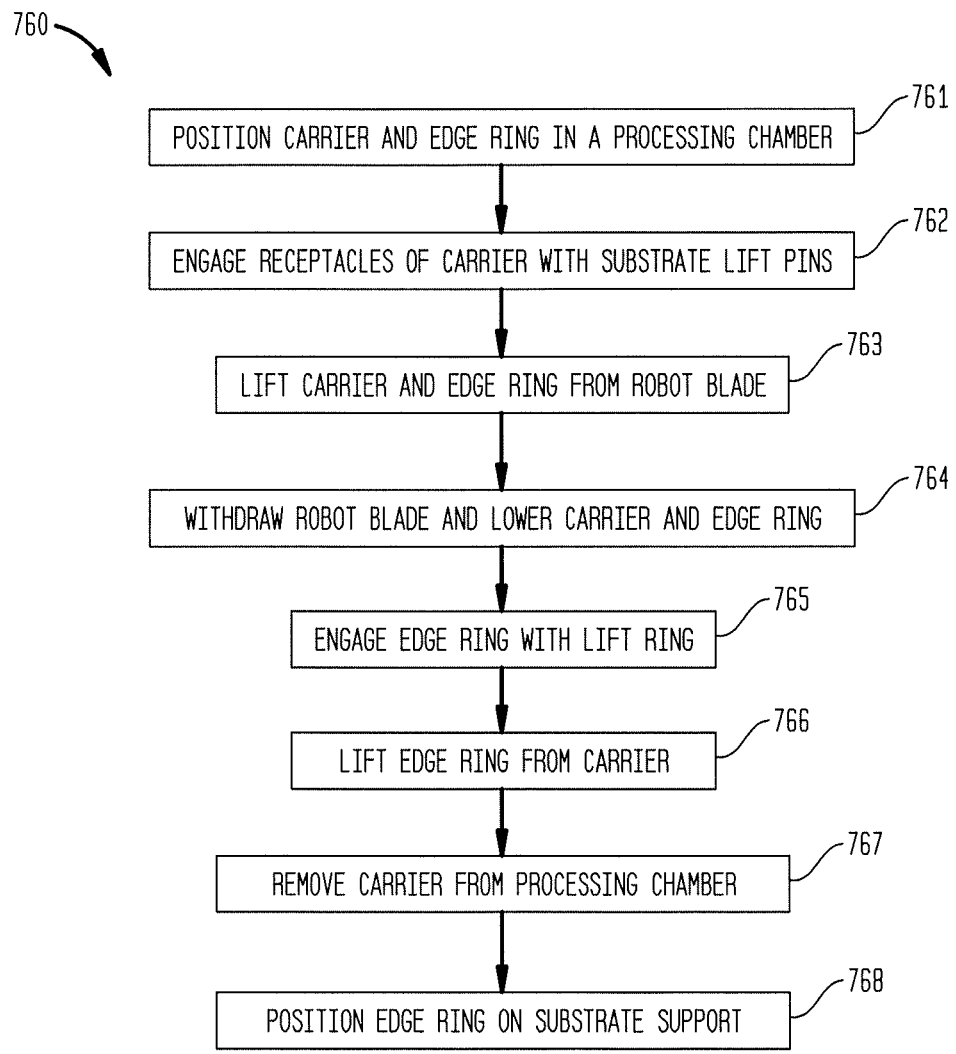
FIG. 7 is a flow diagram of a method of placing an edge ring, according to one aspect of the disclosure.

FIG. 6A schematically illustrates a top perspective view of an interior of a processing chamber 107. The processing chamber 107 includes a port 108, such as a slit valve, to facilitate ingress and egress of a robot blade 548 and robot wrist 549. In operation 761 of method 760, a carrier 213 having an edge ring 110 thereon is positioned in a processing chamber 107 via the robot blade 548. The carrier 213 and the edge ring 110 are centered over an electrostatic chuck of a substrate support 680, as shown in FIG. 6A. The dimensions of the carrier 213 are selected to allow the carrier 213 and the edge ring 110 to pass through the port 108 without requiring dimensional changes to the port 108. Thus, the carrier 213 can be used on existing chambers without the need to significantly reconfigure dimensions of the processing chamber 107. However, it is contemplated that dimensional changes to the port 108 may occur to provide additional clearance for ingress and egress of the carrier 213.

Figure 6B:
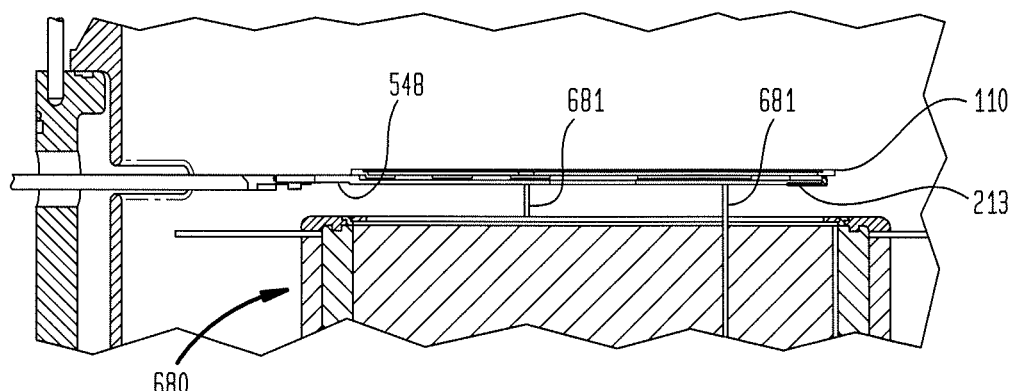
Figure 6C:
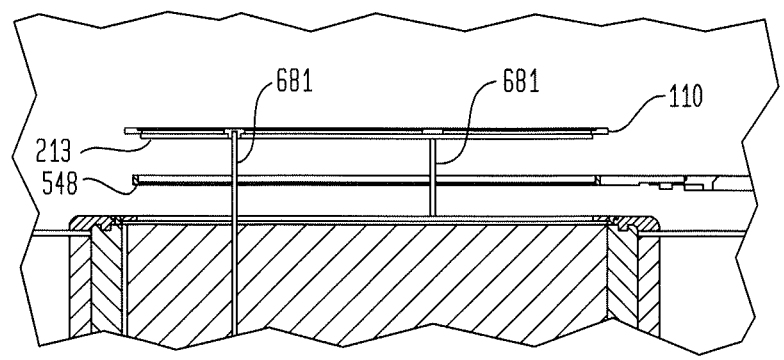

In operation 762, as shown in FIG. 6B, substrate lift pins 681 (e.g., a first set of lift pins) are actuated into contact with receptacles 219 of the carrier 213. In one example, three (3) substrate lift pins 681 are actuated such that each substrate lift pin 681 engages a respective receptacle 219. The substrate lift pins 681 and the receptacles 219 are positioned to allow engagement therebetween without interference from the robot blade 548. Subsequently, in operation 763, the substrate lift pins 681 are actuated further upward to lift the carrier 213 and the edge ring 110 supported thereon from the robot blade 548. In such a configuration, the carrier 213 and the edge ring 110 are positioned above and separated from the robot blade 548, as shown in FIG. 6C.

Figure 6D:
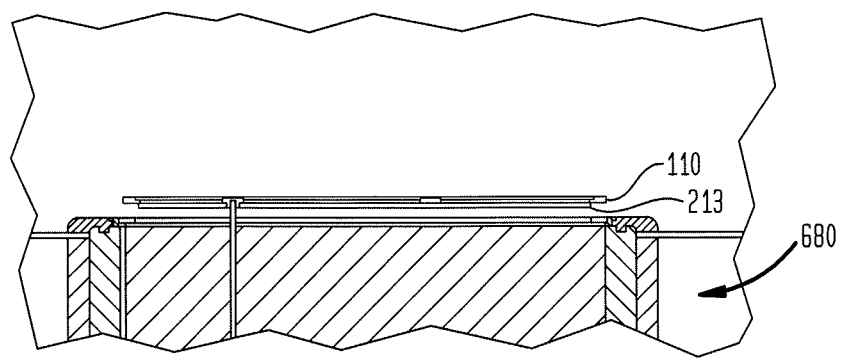

In operation 764, the robot blade 548 is withdrawn from the processing chamber 107, and the carrier 213 and the edge ring 110 are lowered towards the substrate support 680, as shown in FIG. 6D. In one example, the carrier 213 is lowered to a position that is spaced from an upper surface of the substrate support 680, but is below a horizontal plane of the robot blade 548 or the initial engagement position of operation 762.

Figure 6E:
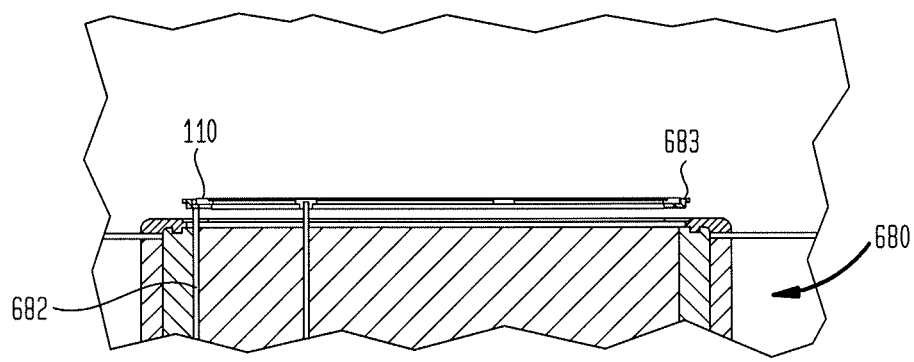

In operation 765, outer lift pins 682 (e.g., a second set of lift pins), located radially outward of the substrate lift pins 681, actuate upward. The outer lift pins 682 are disposed below a lift ring 683, and thus, when actuated upward, elevate the lift ring 683 form a surface of the substrate support 680. The lift ring 683 is actuated upward via the outer lift pins 682 to contact a bottom surface of the edge ring 110, as shown in FIG. 6E. The lift ring 683 includes a stepped surface on an inner perimeter to receive the edge ring 110 therein. Alternatively, the lift ring 683 may include a tapered surface to facilitate alignment.

Figure 6F:
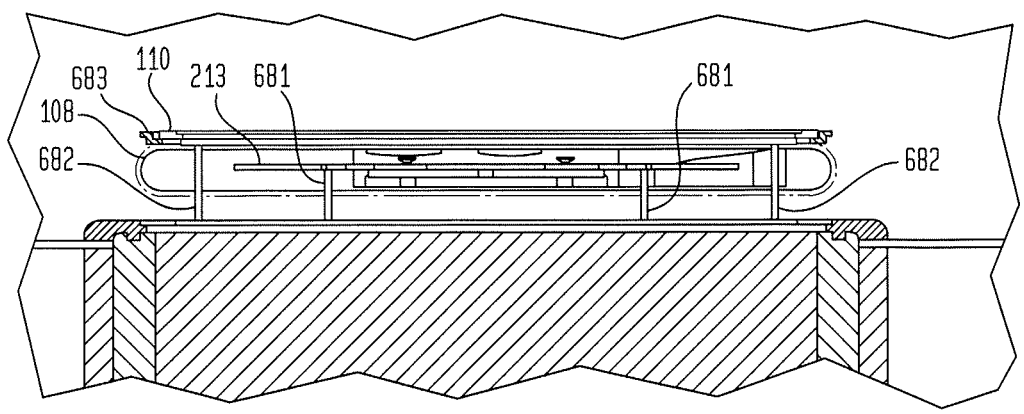

In operation 766, the edge ring 110 is lifted from the carrier 213, as shown in FIG. 6F. For reference, FIG. 6F shows a schematic side view that is rotated by about ninety degrees with respect to FIG. 6E to show a different cross-section of the carrier 213. The edge ring 110 is lifted by actuating the lift ring 683 further upward with the outer lift pins 682. In operation 766, the carrier 213 remains positioned on the substrate lift pins 681 while the edge ring 110 is lifted therefrom. In such a configuration, the carrier 213 is positioned in a first plane, and the lift ring 683 and the edge ring 110 located thereon are positioned in a second plane above the first plane. In one example, the carrier 213 may also optionally be lifted upward to align the carrier 213 with a port 108 to facilitate removal of the carrier 213 from the processing chamber 107. In such an example, the lift ring 683 and the edge ring 110 are still positioned above the carrier 213.

Figure 6G:
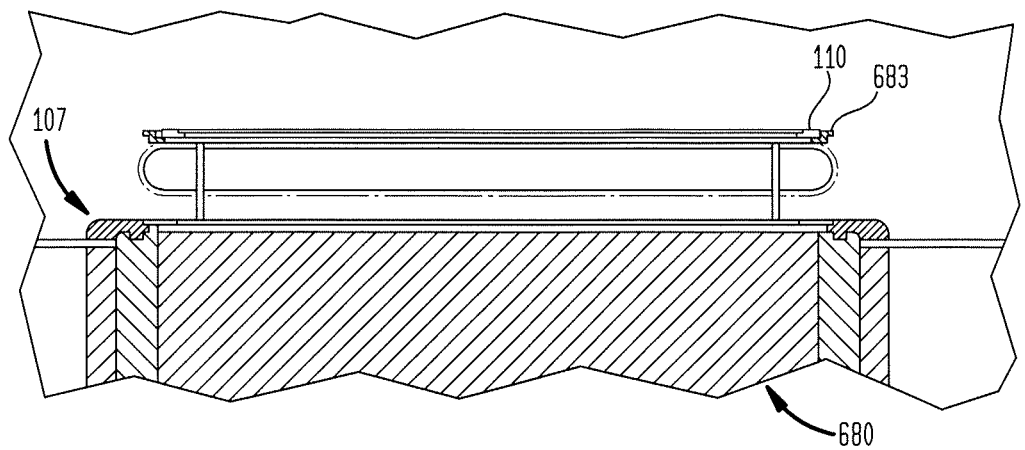

In operation 767, the carrier 213 is removed from the processing chamber 107, as shown in FIG. 6G. The carrier 213 is removed by inserting the robot blade 584 back into the processing chamber 107 and lowering the carrier 213 onto the robot blade 584 using the substrate lift pins 681. The substrate lift pins 681 are further lowered into the substrate support 680 to reduce the likelihood of interference with the substrate lift pins 681. With the carrier 213 positioned on the robot blade 584, the robot blade 584 is withdrawn from the processing chamber 107.

The parallel edges 214a, 214b (shown in FIG. 2A) provide clearance with respect to the outer lift pins 682, allowing the carrier 213 to be withdrawn from the processing chamber 107 while the outer lift pins 682 remain extended in a vertically-lifted position. The carrier 213 can be withdrawn separate from the edge ring 110, as described, thus leaving the edge ring 110 in the processing chamber 107.

Figure 6H:
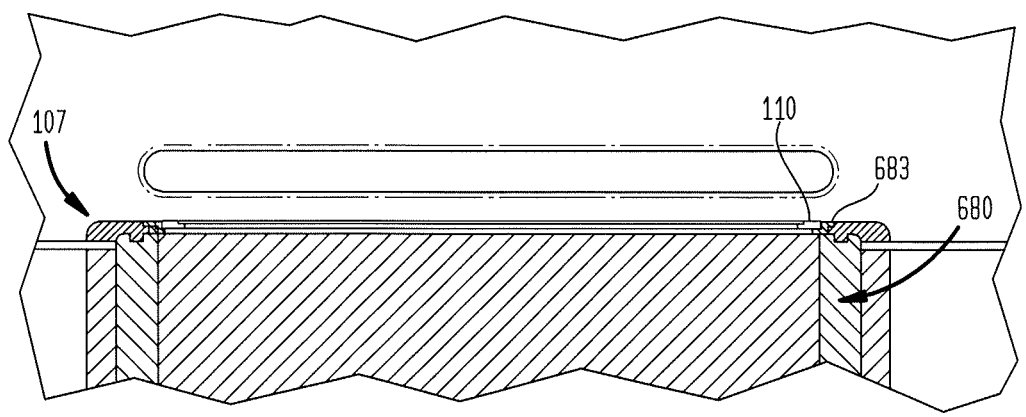

In operation 768, with the carrier 213 and the robot blade 584 removed from the processing chamber 107, the lift ring 683 and the edge ring 110 are positioned on the substrate support 680, as shown in FIG. 6H. In such an example, the lift ring 683 is lowered downward via actuation of the outer lift pins 682 until the lift ring 683 is in contact with the substrate support 680, thus positioning the edge ring 110 in a predetermined location. In one example, the edge ring 110 may include an alignment tab or other indexing feature to facilitate proper alignment of the edge ring 110 on the substrate support 680.

Figure 6I:
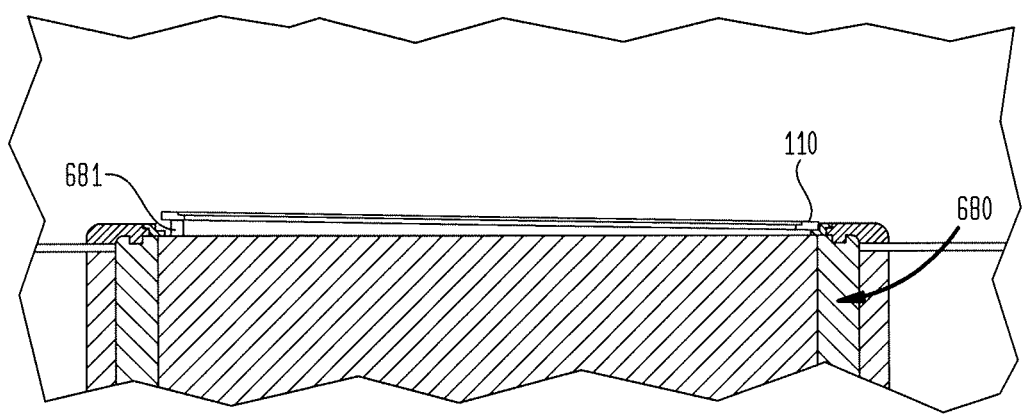

In an alternative example to FIG. 6H, shown in FIG. 6I, the edge ring 110 may be disposed on the substrate support 680 such that one or more lift pins 681 positions the edge ring 110 in a non-parallel configuration with respect to an upper surface of the substrate support 680 for processing. For example, a lift pin 681 may lift one section of the edge ring 110 to a relative height (with respect to the substrate support 680) greater than another section of the edge ring 110. In doing so, a plasma sheath adjacent the substrate support 680 is affected. Thus, the position of the edge ring 110 may be chosen to affect the plasma sheath in order to result in more uniform processing.

While FIG. 7 illustrates one example of a method of transferring the edge ring 110, other examples are also contemplated. For example, it is contemplated that an edge ring 110 may be removed from the processing chamber 100 by performing the method 670 in reverse.

In addition, it is contemplated that aspects of the present disclosure may be utilized to further adjust plasma uniformity. In one example, the outer lift pins 682 may adjust the planarity of the edge ring 110 with respect to the substrate support 680 once the edge ring 110 is positioned on the substrate support 680. For example, after operation 768, small adjustments may be made to the plane of the edge ring 110 by adjusting the vertical position of one or more of the outer lift pins 682 to affect the plasma sheath and/or chemistry in a specific location near the edge ring 110 (or a substrate being processed). In such an example, substrate processing may occur with the edge ring 110 being non-planar with respect to a substrate surface.

FIG. 8A is a schematic illustration of the carrier 213 when in use within a degassing chamber, such as the degassing chamber 104a (shown in FIG. 1). FIG. 8B and FIG. 8C are schematic perspective views of a support structure 885 used within the degassing chamber, according to aspects of the disclosure.

The interior of the degassing chamber includes a plurality of support structures 885 (three are shown). The support structures 885 are configured to support substrates, such as semiconductor wafers, or carriers thereon, during a degassing operation. The support structures 885 are oriented and configured to support semiconductor wafers, which generally have a circular shape, as well as the substrate carrier 213, which has a semi-circular shape.

Each support structure 885 includes a base 886 having a first end 887a and a second end 887b. A cross-member 888 is disposed at the first end 887a of the base 886. The cross-member 888 is disposed in the same plane as the base 886, sharing a coplanar upper surface therewith. The cross-member 888 has a width greater than the base 886 and is oriented perpendicular to the base 886. The cross-member 888 includes an opening 889 formed therethrough, and at least two support posts 890 extending from a lower surface of the cross member 888. The two support posts 890 are positioned on opposite sides of the opening 889 and may have a cylindrical shape. In one example, the support posts 890 are axially movable or adjustable with respect to the cross-member 888.

The support structure 885 also includes a vertical member 891 extending from the second end 887b of the base 886. The vertical member 891 extends in a direction parallel to the axis of the support posts 890. In one example, the vertical member 891 extends in a direction opposite to the two support posts 890 relative to or from the base 886. The vertical member 891 includes a ball bearing 892 at a distal end thereof. In another example, the vertical member 891 includes a contact pad at a distal end thereof. The ball bearing 891 (or contact pad) facilitates contact with a substrate without marring the surface of the substrate. The contact pad or the ball bearing 892 may be formed from ceramic or another material that mitigates particle generation. In one example, a contact pad or the ball bearing 892 is configured to support a substrate thereon during processing.

During operation, a substrate, such as a semiconductor wafer, is transferred into the degassing chamber 104a and positioned on support structures 885. Due to the size and shape of the substrate, the substrate is able to contact all ball bearings 892 of the support structures 895. However, due to the semicircular shape of a carrier 213, a carrier 213 is unable to contact all ball bearings 892 of the support structures 895. However, the carrier 213 is able to contact the upper surface of the base 886 and the cross-member 888 of each support structure 885, thereby allowing the support structures to support both semiconductor substrates as well as the carriers 213.

Referring to FIG. 8A, to facilitate support of multiple substrates, the orientation of the support structures 885 is adjustable. In the illustrated example, two support members 885 are oriented such that the vertical member 891 is located radially inward, while a third support member 895 is oriented such that a respective vertical member 891 is located radially outward (e.g., 180 degrees with respect to one another). It is contemplated that each support member 895 may be rotated about an axis of the opening 889 to position each support member 895 in a desired configuration. The support posts 890 may engage a corresponding receptacle to prevent further rotational movement of each support member 895 when each support member 895 is in a desired location.

FIGS. 8A-8C illustrate one aspect of the disclosure, however, other aspects are also contemplated. In an alternative example, a degassing chamber 104a may include more than three support structures 885.

Figure 9:
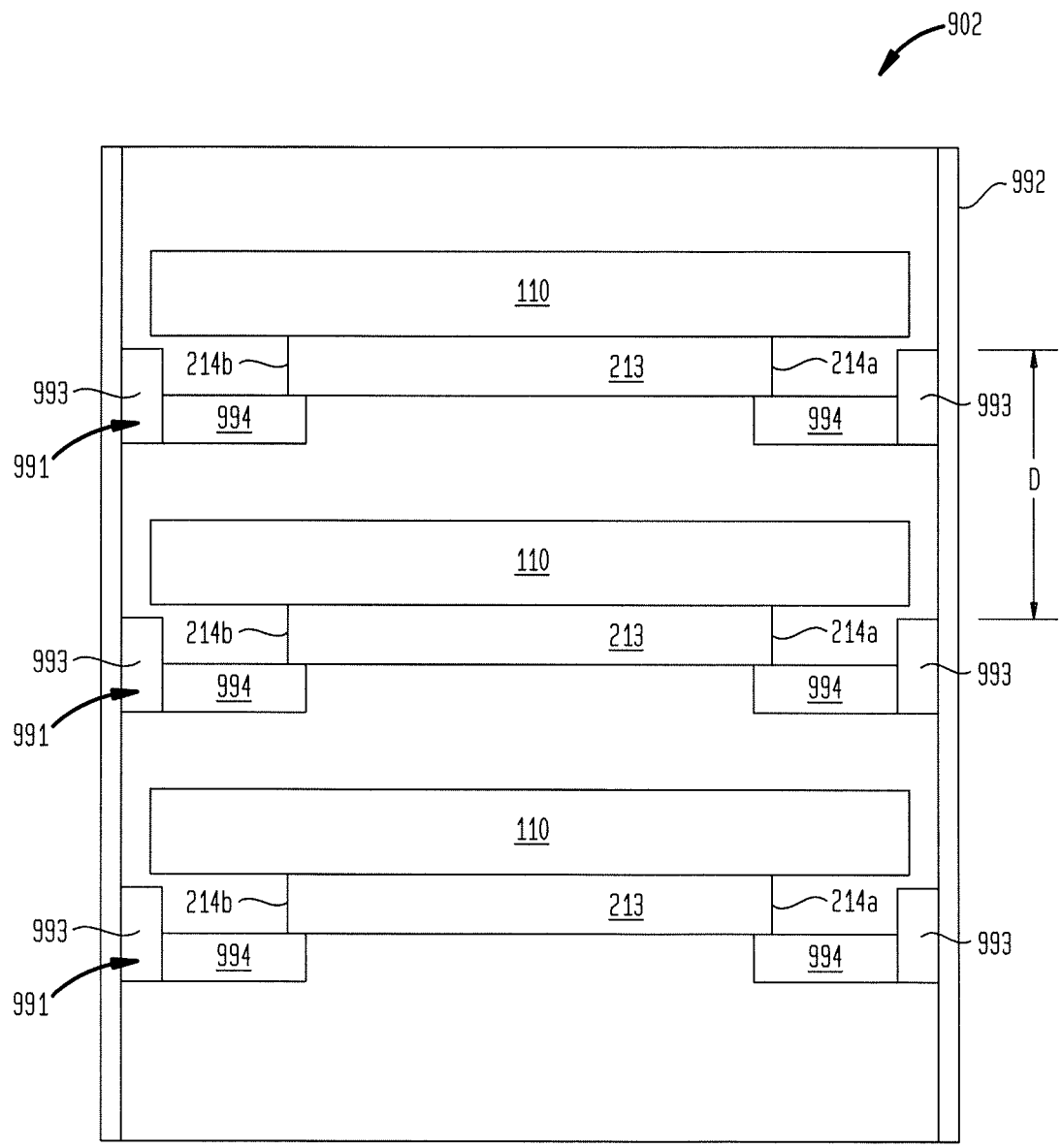
FIG. 9 discloses a cassette, according to one aspect of the disclosure.

FIG. 9 discloses a cassette 902, according to one aspect of the disclosure. The cassette 902 is configured to house one or more carriers 213 each having an edge ring 110 thereon (three of each are shown). Each carrier 213 is positioned on a comb 991, spaced from one another by a distance "D". The distance D is selected to a desired amount of robot clearance within the cassette 902. Each comb 991 includes opposing support structures coupled to internal surfaces of a housing 992. Each support structure includes a base 993 coupled to the housing 992, and an extension 994 that extends inward from a respective base 993 in a stepped configuration.

Carriers 213 of the present disclosure have opposing parallel edges 214a, 214b, and thus are not circular, which prevents support in conventional cassettes. However, the cassettes 902 of the present disclosure include extensions 994 extending radially inward to support a respective carrier 213 along the opposing parallel edges 214a, 214b. The stepped surface of each comb 991 prevents interference with an edge ring 110 when supporting a carrier 213 thereon. In one example, the size and position of the bases 993 of the combs 991 may be selected to allow support of a substrate, such as semiconductor wafer, thereon. Thus, the cassette 902 may be used both for introducing the carrier 213 and edge ring 110 to a processing system 100, as well as for introducing substrates to the processing system 100 for processing. In another example, a conventional cassette may be modified to include the extensions 994.

Benefits of the disclosure include having the ability to replace an edge ring without venting and opening a processing chamber. Because venting is avoided, chamber uptime is improved and maintenance costs are reduced. Moreover, replacing an edge ring without opening a processing chamber enables selection of edge ring shape or material to optimize performance of a specific etch application. Because conventional approaches require a significant amount of time to exchange edge rings for specific applications, doing so with conventional systems is impractical. However, because edge rings can be quickly exchanged or replaced using aspects described herein, it is now feasible to swap edge rings as dictated by process parameters.

Moreover, processing uniformity is also improved by aspects described herein. Because conventional approaches require significantly longer to replace edge rings, the time between preventative maintenance of edge rings is maximized in conventional systems to mitigate downtime. However, doing so results in well-worn edge rings immediately prior to the preventative maintenance. Because the shape and material of an edge ring affects the plasma sheath and chemistry concentrations near the edge of the substrate being processed, processing uniform may decrease due to the presence of a well-worn edge ring. However, because aspects of the present disclosure allow edge rings to be quickly replaced when beginning to wear, edge rings can be replaced more frequently without significant downtime, thereby leading to greater process uniformity.

While aspects herein are described with respect to semi-circular plates and carriers, it is contemplated that the carriers may be completely circular.

While the foregoing is directed to aspects of the present disclosure, other and further aspects of the disclosure may be devised without departing from the basic scope thereof, and the scope thereof is determined by the claims that follow.

What is claimed is:

1. A carrier for supporting an edge ring, comprising:
a plate having a perimeter including two opposing curved edges;
a first plurality of receptacles disposed in the plate with each configured to receive a lift pin therein, the first plurality of receptacles being disposed in the plate along a first triangular pattern having a first base side and two sides that extend from the first base side and intersect at a first apex that points in a first direction;
a second plurality of receptacles disposed in the plate with each configured to engage a supporting structure, the second plurality of receptacles being disposed in the plate along a second triangular pattern having a second base side and two sides that extend from the second base side and intersect at a second apex that points in a second direction that is opposite of the first direction, wherein the second base side of the second triangular pattern is parallel to the first base side of the first triangular pattern;
a first arcuate support structure coupled to one of the two opposing curved edges, the first arcuate support structure extending above a plane of an upper surface of the plate, and the first arcuate support structure comprising:
a stepped surface formed on a radially outward edge of the first arcuate support structure and disposed above the plane of the upper surface of the plate, the stepped surface of the first arcuate support structure comprising:
a supporting surface positioned parallel to the upper surface of the plate, and
a wall positioned radially inward of the supporting surface of the first arcuate support structure and oriented perpendicular to the upper surface of the plate, the wall of the first arcuate support structure extending upward relative to the supporting surface of the first arcuate support structure; and
a second arcuate support structure coupled to the other of the two opposing curved edges, the second arcuate support structure extending above the plane of the upper surface of the plate, and the second arcuate support structure comprising:
a stepped surface formed on a radially outward edge of the second arcuate support structure and disposed above the plane of the upper surface of the plate, the stepped surface of the second arcuate support structure comprising:
a supporting surface positioned parallel to the upper surface of the plate, and
a wall positioned radially inward of the supporting surface of the second arcuate support structure and oriented perpendicular to the upper surface of the plate, the wall of the second arcuate support structure extending upward relative to the supporting surface of the second arcuate support structure.

2. The carrier of claim 1, wherein the plate comprises a semi-circular plate having the perimeter defined by two parallel edges with the two opposing curved edges coupling the two parallel edges.

3. The carrier of claim 1, wherein the first plurality of receptacles are located radially inward with respect to the second plurality of receptacles from a center of the plate.

4. The carrier of claim 1, wherein each of the first plurality of receptacles comprises a cap disposed within a bore of the plate.

5. The carrier of claim 1, wherein each of the first plurality of receptacles comprises a body with a recess extending into the body, and wherein the recess comprises an oblong or parabolic shape.

6. The carrier of claim 1, wherein each of the second plurality of receptacles comprises a body disposed within an opening in the plate, the body comprising a flared portion with an increased outer diameter with respect to the body and a bore formed through the body.

7. The carrier of claim 1, wherein the plate comprises a plurality of openings formed therethrough.

8. The carrier of claim 7, wherein the plurality of openings comprise a round central opening formed in the plate and a plurality of semi-circular openings positioned concentrically around the round central opening, the first plurality of receptacles are positioned radially outward of the plurality of semi-circular openings, and the second plurality of receptacles are positioned radially outward of the first plurality of receptacles.

9. The carrier of claim 1, wherein a distance between the wall of the first arcuate support structure and the wall of the second arcuate support structure is equal to or lesser than an inner diameter of the edge ring such that the edge ring engages the supporting surface and the wall of each of the first arcuate support structure and the second arcuate support structure.

10. A carrier apparatus for transferring an edge ring, comprising:
a robot blade, the robot blade comprising:
a base,
two fingers extending from the base,
a base carrier engagement feature coupled to an upper surface of the base, and
finger carrier engagement features each coupled to an upper surface of a respective one of the two fingers; and
a carrier supported on the robot blade, the carrier comprising:
a plate having a perimeter including two opposing curved edges,
a first plurality of receptacles disposed in the plate with each configured to receive a lift pin therein, the first plurality of receptacles being disposed in the plate along a first triangular pattern having a first base side and two sides that extend from the first base side and intersect at a first apex points in a first direction,
a second plurality of receptacles disposed in the plate with each configured to engage the robot blade, the second plurality of receptacles being disposed in the plate along a second triangular pattern having a second base side and two sides that extend from the second base side and intersect at a second apex that points in a second direction that is opposite of the first direction, wherein the second base side of the second triangular pattern is parallel to the first base side of the first triangular pattern,
a first arcuate support structure coupled to one of the two opposing curved edges, the first arcuate support structure extending above a plane of an upper surface of the plate, and the first arcuate support structure comprising:
a stepped surface formed on a radially outward edge of the first arcuate support structure and disposed above the plane of the upper surface of the plate, the stepped surface of the first arcuate support structure comprising:
a supporting surface positioned parallel to the upper surface of the plate, and
a wall positioned radially inward of the supporting surface of the first arcuate support structure and oriented perpendicular to the upper surface of the plate, the wall of the first arcuate support structure extending upward relative to the supporting surface of the first arcuate support structure, and
a second arcuate support structure coupled to the other of the two opposing curved edges, the second arcuate support structure extending above the plane of the upper surface of the plate, and the second arcuate support structure comprising:
a stepped surface formed on a radially outward edge of the second arcuate support structure and disposed above the plane of the upper surface of the plate, the stepped surface of the second arcuate support structure comprising:
a supporting surface positioned parallel to the upper surface of the plate, and
a wall positioned radially inward of the supporting surface of the second arcuate support structure and oriented perpendicular to the upper surface of the plate, the wall of the second arcuate support structure extending upward relative to the supporting surface of the second arcuate support structure.

11. The carrier apparatus of claim 10, wherein the base carrier engagement feature comprises a first base pad and a second base pad coupled to an upper surface of the base, and wherein the finger carrier engagement features each comprise an end pad disposed at a distal end of the respective one of the two fingers, wherein the carrier is supported on the first base pad, the second base pad, and the end pad of each of the finger carrier engagement features of the robot blade.

12. The carrier apparatus of claim 11, further comprising a roller positioned between the first base pad and the second base pad, wherein the roller is configured to actuate from the base and towards the two fingers.

13. The carrier apparatus of claim 10, wherein:
the base comprises an elevated ridge formed on the upper surface thereof;
each finger of the two fingers comprises an elevated ridge formed on the upper surface thereof at a distal end thereof; and
the elevated ridges of the two fingers and the elevated ridge of the base are arcs of a common circle.

14. The carrier apparatus of claim 10, wherein:
the base carrier engagement feature comprises an engagement post formed on the upper surface of the base; and
the finger carrier engagement features each comprise an engagement post formed on the upper surface of each respective finger of the two fingers.

15. The carrier apparatus of claim 14, wherein the engagement posts of the base and the two fingers each include a rounded upper surface for minimizing contact with a substrate when supported thereon.

16. The carrier apparatus of claim 11, wherein the first base pad and the second base pad each comprise an upper surface that supports the carrier, and the upper surface of each of the first base pad and the second base pad comprises a step adjacent the base and a tapered portion tapering downward from the step towards the distal end of a respective one of the two fingers, and wherein the end pad comprises an upper surface that supports the carrier, and the upper surface of the end pad comprises a planar portion and a tapered portion tapering downward from the planar portion towards the base.

* * * * *